(12) United States Patent
Cheng et al.

(10) Patent No.: US 7,785,959 B2
(45) Date of Patent: *Aug. 31, 2010

(54) METHOD OF MULTI-PORT MEMORY FABRICATION WITH PARALLEL CONNECTED TRENCH CAPACITORS IN A CELL

(75) Inventors: Kangguo Cheng, Beacon, NY (US); Ramachandra Divakaruni, Ossining, NY (US); Jack A. Mandelman, Flat Rock, NC (US); Carl J. Radens, LaGrangeville, NY (US); Geng Wang, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 12/316,748

(22) Filed: Dec. 16, 2008

(65) Prior Publication Data

US 2009/0176339 A1 Jul. 9, 2009

Related U.S. Application Data

(63) Continuation of application No. 11/306,749, filed on Jan. 10, 2006, now Pat. No. 7,485,525.

(51) Int. Cl.
*H01L 21/8242* (2006.01)
(52) U.S. Cl. ............... 438/242; 438/246; 257/302; 257/E21.652
(58) Field of Classification Search ............ 438/242, 438/246; 257/302, E21.652
See application file for complete search history.

(56) References Cited

U.S. PATENT DOCUMENTS

| 5,981,332 | A | * | 11/1999 | Mandelman et al. | 438/246 |
| 6,015,985 | A | * | 1/2000 | Ho et al. | 257/301 |
| 6,504,204 | B1 | * | 1/2003 | Hsu et al. | 257/306 |
| 2001/0023956 | A1 | * | 9/2001 | Collins et al. | 257/301 |
| 2003/0132438 | A1 | * | 7/2003 | Jang | 257/68 |
| 2004/0174733 | A1 | | 9/2004 | Kirihata et al. | |
| 2004/0248363 | A1 | * | 12/2004 | Bard et al. | 438/243 |
| 2005/0048715 | A1 | * | 3/2005 | Rupp et al. | 438/244 |
| 2005/0051765 | A1 | | 3/2005 | Rosskopf et al. | |
| 2006/0205144 | A1 | * | 9/2006 | Li et al. | 438/243 |

FOREIGN PATENT DOCUMENTS

WO  WO 00/19437  4/2000

OTHER PUBLICATIONS

EP Search Report; Jan. 4, 2009.
EP Official Action—Application No. 07 710 032.9-2210 dated Jun. 30, 2009.

* cited by examiner

*Primary Examiner*—Steven J Fulk
(74) *Attorney, Agent, or Firm*—H. Daniel Schnurmann (57) ABSTRACT

A method is provided for fabricating a multi-port memory in which a plurality of parallel connected capacitors are in a cell. A plurality of trench capacitors are formed which have capacitor dielectric layers extending along walls of the plurality of trenches, the plurality of trench capacitors having first capacitor plates and second capacitor plates opposite the capacitor dielectric layers from the first capacitor plates. The first capacitor plates are conductively tied together and the second capacitor plates are conductively tied together. In this way, the first capacitor plates are adapted to receive a same variable voltage and the second capacitor plates are adapted to receive a same fixed voltage.

8 Claims, 8 Drawing Sheets

METHOD OF MULTI-PORT MEMORY FABRICATION WITH PARALLEL CONNECTED TRENCH CAPACITORS IN A CELL

CROSS-REFERENCE TO RELATED APPLICATION

This application is a continuation of U.S. patent application Ser. No. 11/306,749 filed Jan. 10, 2006, now U.S. Pat. No. 7,485,525, the disclosure which is hereby incorporated herein.

BACKGROUND OF THE INVENTION

The present invention relates to semiconductor integrated circuits, and more particularly to integrated circuits including dynamic random access memories ("DRAMs") having multiple ports and which incorporate trench capacitors.

In integrated circuit memories such as static random access memories ("SRAMs") and DRAMs, each storage cell or "memory cell" traditionally has only a single port for providing read and write access to a data bit stored therein. However some types SRAMs and DRAMs have memory cells which include multiple ports per memory cell for providing simultaneous read and/or write access. For example, in a dual port DRAM, a data bit can be simultaneously read from two separate memory cells or written to two separate memory cells that belong to the same column of memory cells in the DRAM. In addition, a data bit can be simultaneously read from one memory cell of the column and written to a separate memory cell of the same column.

In a particular example, commonly assigned U.S. Pat. No. 6,504,204 to Hsu et al. describes a dual port DRAM. Each memory cell of the dual port DRAM is accessible simultaneously through each of two bitlines and through each of two wordlines. The dual port DRAM enables performance gains over DRAMs having traditional single port memory cells because data bits can be read simultaneously from different cells along the same column of memory cells. Thus, the DRAM can be read from one memory cell of a column through a first bitline and simultaneously written to another memory cell of the same column through a second bitline. In addition, when both of the bitlines of a column are used to access the same memory cell, faster reading or writing can be performed because of the greater current carried by the two bitlines than one bitline.

However, further improvements in the structure and performance of a dual port DRAM are possible.

SUMMARY OF THE INVENTION

An integrated circuit is provided which includes a dynamic random access memory ("DRAM") having multiple ports per memory cell for accessing a data bit within each of a plurality of the memory cells of the DRAM. Such DRAM includes an array of memory cells in which each memory cell includes a plurality of capacitors connected together as a unitary source of capacitance. A first access transistor is coupled between a first one of the plurality of capacitors and a first bitline and a seconds access transistor is coupled between a second one of the plurality of capacitors and a second bitline. In each memory cell, a gate of the first access transistor is connected to a first wordline and a gate of the second access transistor connected to a second wordline.

According to another aspect of the invention, a method is provided for manufacturing a memory cell having multiple ports for permitting simultaneous read and write access to a data bit stored in the memory cell. Such method includes etching a plurality of trenches into a substrate including a single-crystal semiconductor material. A plurality of trench capacitors having capacitor dielectric layers extending along walls of the plurality of trenches are formed in the substrate, the plurality of trench capacitors having first capacitor plates and second capacitor plates opposite the capacitor dielectric layers from the first capacitor plates, the first capacitor plates being conductively tied together and the second capacitor plates conductively tied together, respectively such that the first capacitor plates are adapted to receive a same variable voltage and the second capacitor plates are adapted to receive a same fixed voltage. A plurality of access transistors are formed, each access transistor having a drain region conductively connected to one of the plurality of trench capacitors. A plurality of conductors are formed which are operable to carry a plurality of control signals to operate the plurality of access transistors and to carry a plurality of data bit signals each representing a state of a data bit for a purpose of at least one of reading the data bit when the data bit is stored in the memory cell or writing the data bit when the data bit is to be stored to the memory cell.

DETAILED DESCRIPTION

Accordingly, in the embodiments of the invention described herein, a novel multiple port DRAM cell is provided which enables increased capacitance to be realized per cell of the DRAM. In addition, a novel method of manufacturing is provided by which greater capacitance is achieved through deliberate use of techniques which would destroy memory cells of traditional single port DRAMs.

Figure 1:
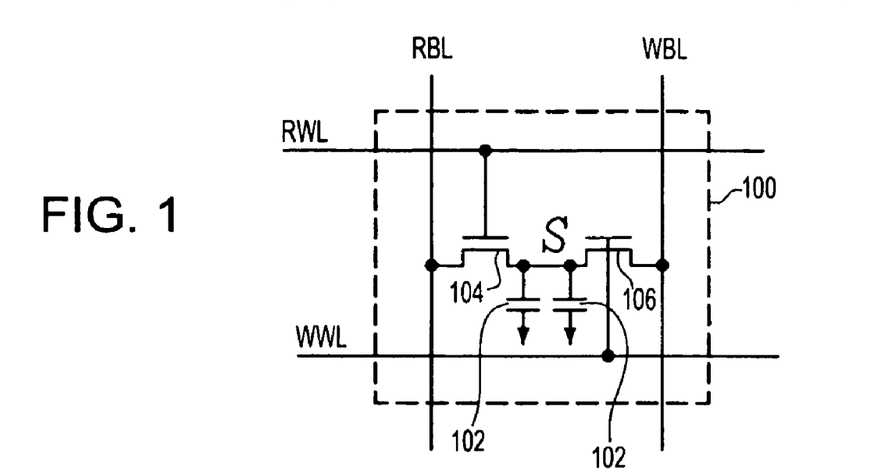
FIG. 1 is a schematic diagram illustrating a dual port memory cell of a DRAM according to an embodiment of the invention.

FIG. 1 is a diagram schematically illustrating one memory cell 100 of a dual port DRAM according to an embodiment of the invention. As illustrated therein, a memory cell of the dual port DRAM includes a pair of parallel-connected storage capacitors 102 connected in parallel between a storage node S and ground. At node S, the memory cell stores a charge at a variable voltage on the capacitors 102. Signals representing the value of a data bit can be transferred to or from the memory cell 100 through either one or both of two bitlines, a read bitline ("RBL") and a write bitline ("WBL"). Preferably, the read bitline RBL is used during a read operation to transmit a signal representing the value of a data bit from the memory cell 100 to data input output ("I/O") circuitry such as a sense amplifier (not shown) of the DRAM. Preferably, the write bitline WBL is used during a write operation to transmit a signal representing the value of a data bit from the memory cell 100 from such data input output ("I/O") (not shown). The memory cell 100 includes a first access transistor 104 or "read transistor", which is preferably used for reading a value of the data bit stored on the capacitors 102 during a read operation. The memory cell 100 also includes a second access transistor 106 or "write transistor", which is preferably used for writing a value of a data bit to the capacitors 102 during a write operation. The read transistor 104 is operated by a read wordline ("RWL") connected to the gate of the read transistor such that when RWL is active, a data bit signal can flow between the variable voltage node S of the storage capacitors 102 and RBL. The write transistor 106 is operated by a write wordline ("WWL") connected to the gate of the write transistor such that when WWL is active, a data bit signal can flow between WBL and the Variable voltage node S of the storage capacitors 102. While the read transistor, RBL and RWL are preferably used for reading the memory cell during a read operation and the write transistor, WBL and WWL are preferably used for writing the memory cell during a write operation, these conventions need not be fixed. With appropriate control and data I/O circuitry coupled to the memory cell, the read transistor, RBL and RWL can be used for writing a data bit value to the memory cell and the write transistor, WBL and WWL can be used for reading a data bit value from the memory cell. In addition, with appropriate control and data I/O circuitry, both sets of read and write transistors, both RBL and WBL bitlines and both RWL and WWL wordlines can be used for writing the memory cell during a write operation, and both such sets of transistors, bitlines and wordlines can be used for reading the memory cell during a read operation.

Figure 2:
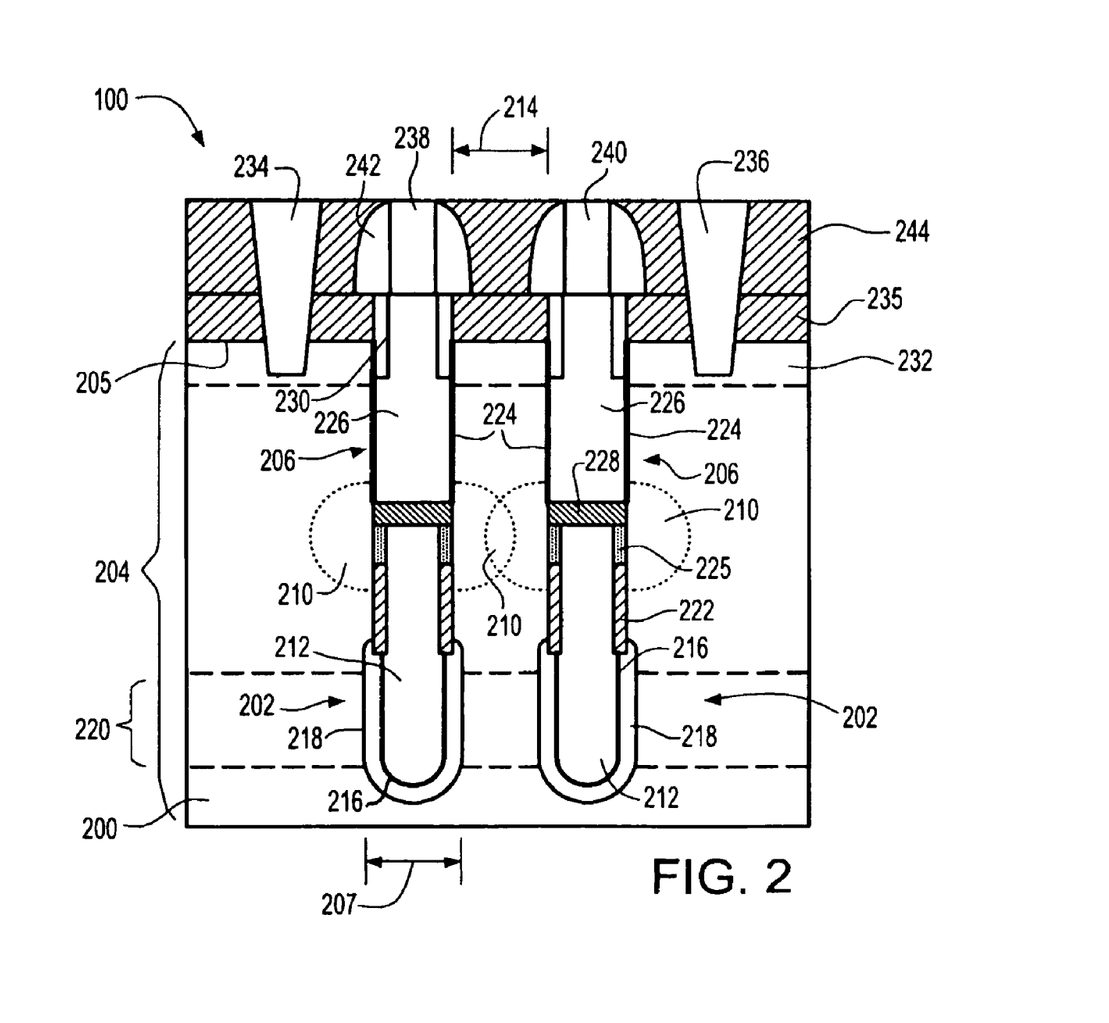
FIG. 2 is a sectional view illustrating a structure of a dual port memory cell according to an embodiment of the invention.

FIG. 2 is a sectional diagram illustrating a structure of a dual port memory cell according to an embodiment of the invention. As shown in FIG. 2, the memory cell includes two trench storage capacitors 202, each of which is provided within a deep trench 204 buried within a single-crystal semiconductor region 200 of a substrate. Preferably, each deep trench is a long and narrow structure, having depth extending between about 2 microns (μm) and about 10 microns from the major (outer) surface 205 of the semiconductor region of the substrate. Preferably, each of the deep trenches has a width 207 in a first lateral direction which is equal to or somewhat greater (10 to 20% greater) than the minimum feature size F that is patternable by standard lithographic process, i.e., without having to employ alternating phase shift mask techniques. The distance 214 in the first lateral direction between outer walls or edges of neighboring deep trenches is substantially less than that normally provided in DRAMs according to the prior art. Prior art DRAMs tend to place the edges of neighboring deep trenches apart by more than the minimum lithographic feature size F, i.e., typically at distances of at least 2F and often 3F or greater. Here, a lateral distance of about 1F or less separates the outer walls of neighboring deep trenches 202 from each other.

In the particular embodiment shown in FIG. 2, the storage capacitors 202 are disposed along walls and bottoms of lower portions of the deep trenches 204, below vertical transistors 206 (field effect transistors or "FETs") which have channel regions oriented vertically along walls of upper portions of the deep trenches 204. As an example, the FETs are n-type FETs or "NFETs") having n-type source and drain regions and channel regions that are doped predominantly p-type. In the following description, reference is made to embodiments in which NFETs are provided, although in other embodiments, the FETs can be p-type FETs or "PFETs".

The storage capacitors 202 include storage nodes 212 of typically metallic (one or more metals or conductive compounds of metals) or doped semiconductor material (typically in polycrystalline form) that are disposed inside lower portions of the deep trenches. The storage nodes 212 together function as a single conductive node S (FIG. 1) of the memory cell, on which a variable voltage is stored. Capacitor dielectric layers 216 are disposed between the storage nodes 212 and the semiconductor material of the substrate surrounding the deep trenches. Preferably, buried plate regions 218 are provided in regions of the semiconductor material immediately surrounding the lower portions of the deep trenches, the buried plate regions being formed typically by outdiffusion of a dopant from inside the deep trenches. The buried plate regions are then preferably electrically connected together at a single electric potential such as ground by a doped region 220 of semiconductor material usually known as an "n-band", the n-band being disposed at a substantially uniform depth throughout the region of the substrate in which the DRAM array is provided.

However, in variations of such embodiment, a second capacitor plate is provided by a metallic material (one or more metals or conductive compounds of metals) lining the inner walls and bottoms of the deep trenches. In still another variation, the region of semiconductor material immediately surrounding the deep trenches need not be doped differently from the semiconductor material of the substrate. Rather, such region can have the same predominant type of dopant e.g., p⁻ type, as that of the substrate in general. In such case, the n-band need not be provided as the semiconductor material of the substrate in general serves as the second plate of the capacitor maintained, for example, at a potential such as ground. As typically provided in DRAMs, isolation collars 222 electrically isolate the deep trenches above the storage capacitors 202 to improve retention periods of the storage capacitors. The isolation collars 222 are typically provided as relatively thick dielectric layers along the walls of the deep trenches to reduce or prevent parasitic conduction along those walls. For further isolation from the vertical FETs above the storage nodes 212, a layer of trench top oxide 228 is provided in each trench.

As further shown in FIG. 1, the vertical NFETs 206 have source regions conductively connected to the storage capacitors 202 through buried strap outdiffusion ("BSOD") regions 210. Specifically, the BSODs 210 extend outward from buried straps 225 of conductive (metallic or semiconductor) material within the deep trenches 204 to form the source regions of the NFETs. These BSODs also conductively connect the source regions to the storage nodes 212 that are provided as inner plates of the storage capacitors formed along walls of the deep trenches. Because of the particular processes by which they are made, the BSODs are overlapped and merge together to provide a continuous conductive region having the same predominant type of dopant, i.e., n-type dopant as the NFETs. In this way, the merged BSODs conductively connect the storage nodes 212 of the capacitors 202 together such that they operate as a single node S (FIG. 1) which simultaneously stores one variable voltage on both storage capacitors 202.

Additional structure shown in FIG. 2 includes dielectric layers 224 provided as gate dielectric layers of the vertical FETs, and gate conductors 226 of metallic (including one or more metals or compounds of metals) and/or doped semiconductor material. At the tops of the trenches, a relatively thick (50 to 100 nm) dielectric layer overlies the major surface 205 of the semiconductor substrate as an "array top oxide" or ("ATO") 235. Dielectric spacers 230 are preferably provided along inner walls of the trenches and corresponding openings in the ATO 235.

An n-type doped region 232 extends laterally just below the major surface 205 of the semiconductor substrate as a drain region for the FETs. Conductive interconnection to the FETs 206 is provided through a conductive via extending downward from the read bitline (FIG. 1) to conductively contact the doped region 232, such via being known as a read bitline contact (RBL) via 234. In addition, a similar conductive extends downward from the write bitline (FIG. 1) to conductively contact the doped region 232 as a write bitline contact (WBL) via 236. In addition, a read wordline (RWL) 238 of metallic (one or more metals or conductive compounds of metals) and/or semiconductor material overlies and contacts a gate conductor 226 within one of the deep trenches of the memory cell. A write wordline (WWL) 240 of similar conductive material overlies and contacts a gate conductor 226 within the other deep trench. Preferably, dielectric spacers 242 are provided on walls of the wordlines as additional electrical isolation. A dielectric gap fill material is disposed between each of the wordlines 238, 240 and the bitline contact vias 234, 236 as an interlevel dielectric layer ("ILD") 244 or portion of ILD above the ATO 235.

Figure 3:
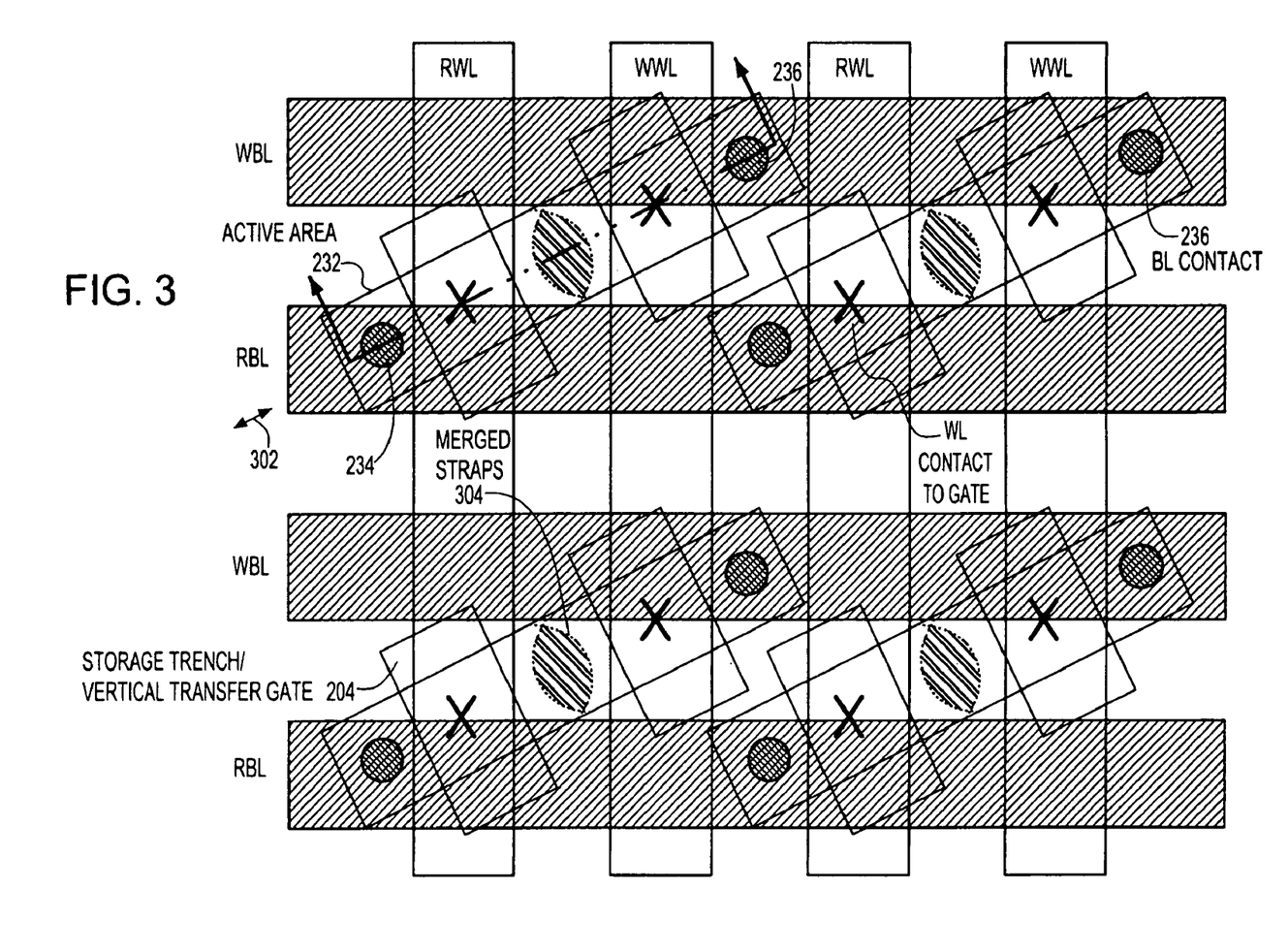
FIG. 3 is a corresponding top-down plan view of a portion of a memory array including a plurality of memory cells according to the embodiment of the invention illustrated in FIG. 2.

FIG. 3 is a top-down plan view further illustrating the embodiment of the invention described above with respect to FIG. 2. As illustrated, the wordlines (RWL and WWL) run in a vertical direction over the surface of the semiconductor region. The bitlines (RBL and WBL) run in a horizontal direction over the surface of the semiconductor region. The n-doped active semiconductor area 232 lying just below the major surface of the semiconductor substrate runs in a lateral direction 302 at an angle to the direction (vertical direction) in which the RWL, WWL conductors run. The active semiconductor area 232 is also aligned at a different angle from the (horizontal) direction in which the RBL, WBL conductors run. Wordlines RWL and WWL conductively contact the gate conductors of each vertical transistor at locations marked by the large "X"s in FIG. 3. The BSODs are overlapped in the middle of the active semiconductor regions at the locations 304 shown. The conductive vias 234, 236 contact locations of the active semiconductor region 232 near the ends thereof.

Figure 4:
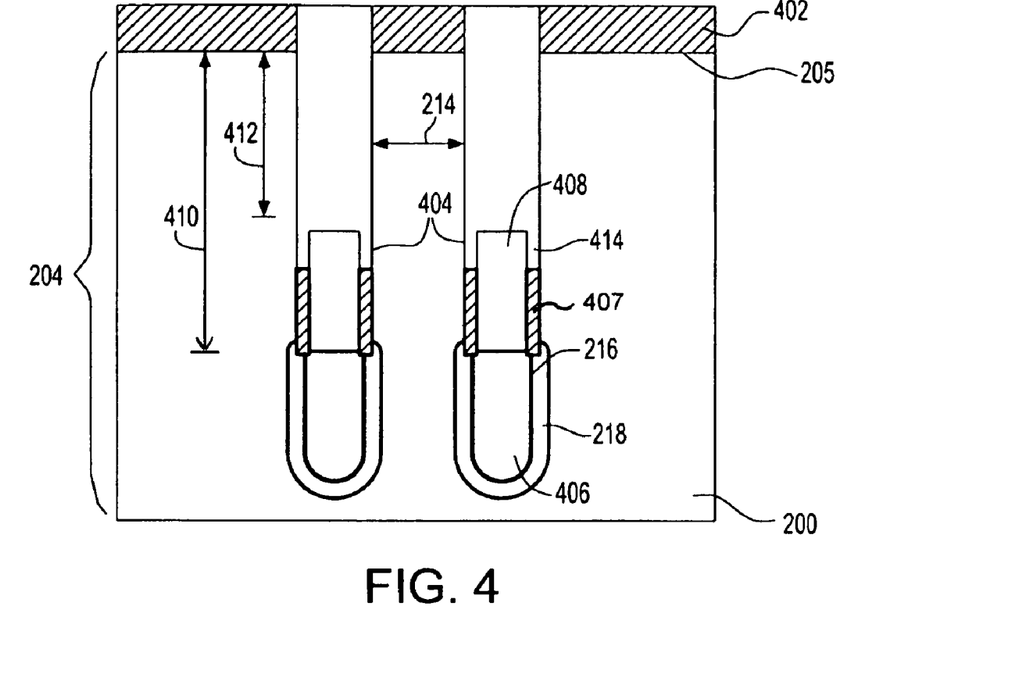
FIGS. 4 and 5 are sectional views illustrating respective stages in a method of fabricating a dual port memory cell in accordance with an embodiment of the invention.

A method of making a DRAM including the memory cell 100 illustrated in FIGS. 2 and 3 will now be described with reference to FIG. 4. As illustrated therein, deep trenches 204 are etched into a semiconductor substrate 200 by a reactive ion etch ("RIE") process through openings in a masking layer 402. The masking layer preferably includes a pad layer having a relatively thick pad nitride layer overlying a somewhat thinner pad oxide layer contacting the major surface 205 of the semiconductor substrate. The masking layer may additionally include a hard mask layer, containing, e.g., an oxide such as borophosphosilicate glass, spin-on-glass, etc., overlying the pad layer. Trenches are etched into the substrate 200 which have an edge-to-edge spacing 214 between the closest walls 404 of each trench which is preferably at or somewhat below the minimum lithographic feature size F for lithographically patterning features in the substrate. As described above, the minimum lithographic feature size is a minimum size at which features can be patterned by lithography for a given generation of semiconductor technology without having to resort to special techniques such as alternating phase shift masks, etc.

One way that this spacing can be achieved is for openings in the masking layer to be set nominally at the minimum lithographic feature size F. Such size results from lithographic processing using a minimum spacing between features on a photomask used to pattern features in a photoresist. If a spacing closer than F is desired, parameters of the RIE process can be adjusted to increase an amount of etching that occurs in a laterally outward direction from the center of the trench. Alternatively, following standard RIE processing to etch the deep trenches in the vertical direction, lateral etching can be performed to widen the deep trenches by a timed isotropic etch. In either case, the resulting deep trenches not only become more closely spaced than by standard RIE process, but also become somewhat larger and able to support higher capacitance due to the increased surface area of the walls and bottoms of the wider deep trenches.

After etching the deep trenches 204 into the substrate 200, buried plate regions 218 are formed within the substrate 200, after which a capacitor dielectric layer, also referred to as a "node dielectric" 216 is deposited to line the walls and bottoms of each deep trench. Illustratively, the node dielectric can include a dielectric compound of silicon, e.g., silicon dioxide, silicon nitride, silicon oxynitride or combination thereof such as a silicon oxide, silicon nitride, silicon oxide ("O—N—O") dielectric structure. Alternatively, the node dielectric can include any one or more of known high-K (high dielectric constant) dielectric materials, among which are oxides and titanates of barium, strontium, hafnium, zirconium, perovskite materials, ferroelectric dielectric materials, etc.

After forming the node dielectric within each trench, a first conducting material 406, e.g., doped polycrystalline silicon ("polysilicon"), one or more metals or compounds of metals, is deposited to fill the trenches. Thereafter, the conducting material within each trench is recessed by a subsequent etch, e.g., a timed etch, to define a depth 410 at which an isolation collar will be subsequently formed in the trench. Subsequent thereto, the isolation collar 407 in each trench is formed by steps including depositing a collar dielectric material, e.g., an oxide, nitride or combination thereof to line the walls of the trenches above the first conducting material 406. A second conducting material 408 is then deposited to fill the trenches again, the second conducting material preferably having a composition like that of the first conducting material. Thereafter, the second conducting material 406 is recessed with the collar dielectric material within each trench to a depth 412.

After recessing the collar dielectric material 407, a timed isotropic etch is then performed to the collar dielectric material to form a divot 414 in the isolation collar, such etch being performed in a manner that is selective to the semiconductor material of the substrate and the second conducting material. In one example, the semiconductor material of the substrate is silicon, the second conducting material is polysilicon and the collar dielectric is silicon dioxide. In such case, the timed isotropic etch can be performed to etch the silicon dioxide collar in a manner selective to silicon and polysilicon.

Figure 5:
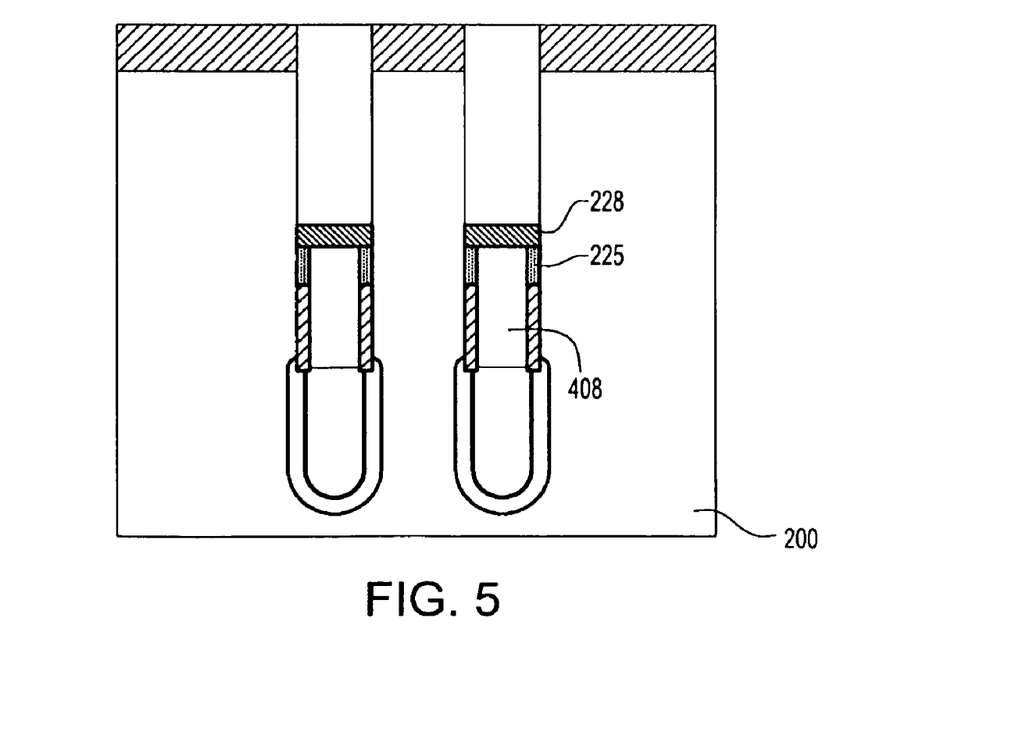

Thereafter, as illustrated in FIG. 5, a third conducting material, e.g., a doped semiconductor such as doped polysilicon, one or more metals and/or one more conductive compounds of metals is deposited to into the deep trenches to fill the divots as a buried strap 225 connecting the second conducting material 408 within each deep trench to the single-crystal silicon material of the substrate 200. Thereafter, this third conducting material is recessed to the depth of the top of the second conducting material, using, for example, a RIE process. A trench top oxide (TTO) 228 is then formed at the top surface of the second conducting material to isolate the second conducting material 408 from overlying conductive structures, i.e., a gate conductor, formed subsequent thereto in an upper portion of the deep trench.

Referring to FIG. 2, thereafter, further processing is performed to form the vertical FET, to define the active semiconductor region, form the BSOD 210, form bitlines, wordlines 238, 240, bitline contacts 234, 236 and other structure shown in FIG. 2. As described above, processing of the memory cell 100 in accordance with embodiments of the invention contrasts with that of conventional DRAMs. Here, the BSODs 210 that extend outward from an adjacent pair of deep trenches of each memory cell 100 are intentionally overlapped so that they provide a single conductive node of the memory cell. This contrasts with that of conventional DRAM cells in which processes are controlled with the express requirement that conduction does not occur between BSODs of adjacent deep trenches.

In addition to or as an alternative to the above-described processing in which the edges of adjacent deep trenches are placed closer to each other than in conventional DRAM memory cells, it is desirable that the BSODs diffuse outward from the node electrode 212 to a greater extent than they do in conventional DRAMs. In order to accomplish such goal, thermal budget (the temperature and/or the duration of high temperature processing) can be increased following the formation of the buried straps 225. Increasing the thermal budget increases the extent to which the BSODs extend outward into the substrate 200. Alternatively, the concentration of the dopant in the conducting material of the buried strap can be increased, which has a similar effect on the extent of the BSODs.

In yet another alternative process or in addition to increasing thermal budget or the dopant concentration in the buried straps, the buried straps can include a dopant which has a relatively low atomic weight. A low atomic weight dopant diffuses outward from the trench faster than a dopant used in conventional DRAM fabrication. For example, the buried straps can include phosphorous as the n-type dopant instead of arsenic which has a higher atomic weight than phosphorous. In this way, the lighter phosphorous dopant diffuses outward from the buried straps 225 more quickly. Therefore, the BSODs extend outward to a greater extent than they do in conventional DRAM processing in which arsenic is used as the dopant.

Figure 6:
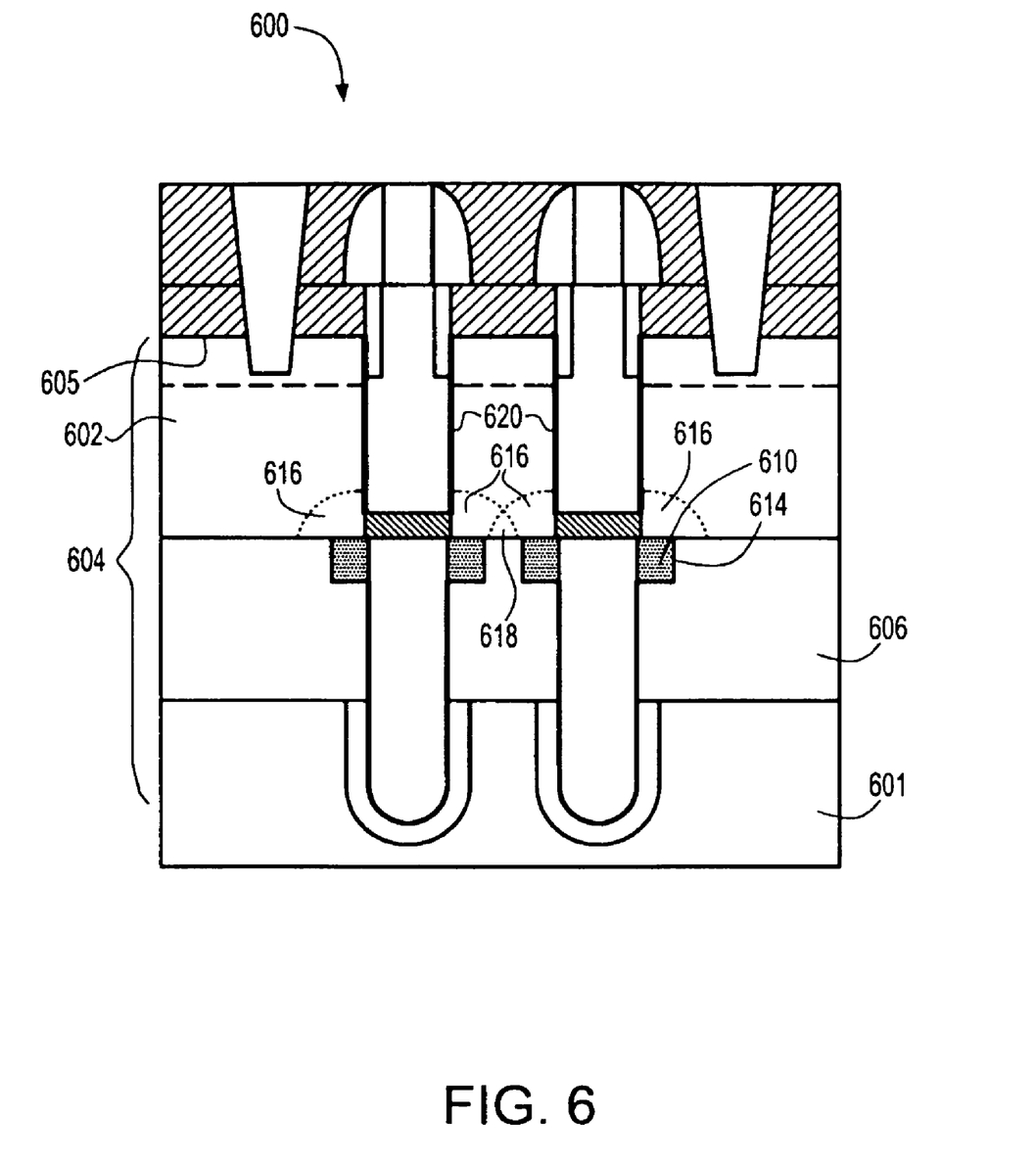
FIG. 6 is a sectional view illustrating a dual port memory cell according to a variation of the embodiment shown in FIG. 2.

FIG. 6 is a sectional view illustrating a memory cell 600 according to a variation of the above-described embodiment shown in FIG. 2. Here, the memory cell 600 is fabricated in a semiconductor-on-insulator substrate, e.g., silicon-on-insulator ("SOI") substrate 601. As shown in FIG. 6, the vertical FETs are disposed in an SOI layer 602 which overlies a bulk portion of the substrate 601 and is separated therefrom by a buried dielectric layer. The buried dielectric layer preferably consists essentially of layer of silicon dioxide, commonly referred to as "BOX" layer 606. The deep trenches 604 extend from the top (major) surface of the SOI layer 602 through the BOX layer 606 and into the bulk region of the substrate 601 below the BOX layer.

As further shown in FIG. 6, for each deep trench the buried strap 610 is disposed within a notch 614 extending outward from the deep trenches 604 and downward from the SOI layer 602. Buried strap outdiffusions ("BSODs") 616 extend outward from the buried straps 610 into the SOI layer 602 adjacent to the buried straps. Alternatively, the buried strap 610 is disposed above the buried oxide 606. In a third embodiment, part of the buried strap 610 is disposed within the notch 614 and the other part of the buried strap 610 is disposed above the buried oxide 606. In other respects, the memory cell 600 is similar to that shown and described above with reference to FIG. 2. As in the above-described embodiment, the BSODs 616 overlap and conductively connect to each other at a location 618 between edges 620 of the adjacent deep trenches 604. Here again, the overlapped BSODs occur as a result of the deliberate use of one or more of the techniques described above for placing the deep trenches at a close spacing and/or intentionally causing a dopant to diffuse outward from the buried straps to a greater extent than in conventional DRAMs.

Figure 7:
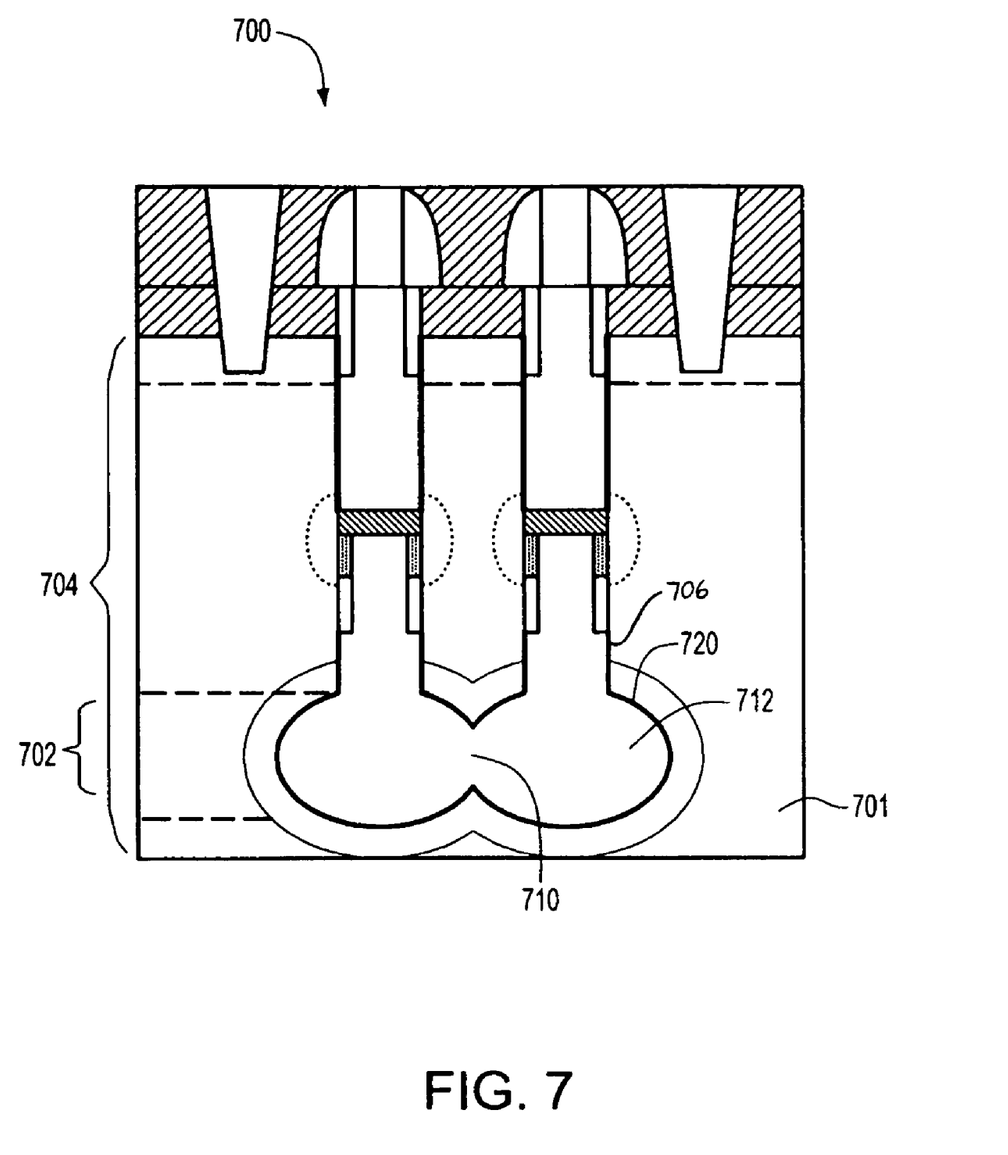
FIG. 7 is a sectional view illustrating a dual port memory cell according to a further variation of the embodiment shown in FIG. 2.

FIG. 7 illustrates a memory cell 700 according to a further variation of the embodiment described above with reference to FIG. 2. In this embodiment, lower portions 702 of adjacent deep trenches 704 have a "bottle" shape. In such embodiment, walls of the deep trenches appear to bulge outward from straight, and preferably vertical walls of upper portions 706 of the trenches which extend above the slower portions 702. Here, processing to form the memory cell 700 is similar to that shown and described above with reference to FIG. 2. However, in this embodiment, special processing is used to widen, i.e., expand the lower portions of the deep trenches 704 causing the lower portions 702 of adjacent deep trenches to merge together at location 710 to form one large connected lower portion 712. In this way, the one large connected lower portion contains one combined region of conductive material functioning as a single storage node 712 for both deep trenches.

Processing is known for widening lower portions of deep trenches. However, in conventional memories including DRAMs, it is a necessity for the widened lower portions of adjacent deep trenches to not connect together. Otherwise, such adjacent deep trenches, which belong to different memory cells, would fail to work as trench capacitors of separate memory cells. By contrast, in the present embodiment, it is a requirement that the widened lower portions of adjacent trenches merge together to form a single conductively joined storage node. Referring to FIG. 7, processing to form the single joined widened lower portions of the trenches can include a masked step of oxidation to oxidize walls and a bottom of each deep trench selectively to an upper portion of the deep trench disposed above the lower portion. The resulting oxide extends outwardly from the walls and bottom of the deep trench into the semiconductor substrate 701. Thereafter, the oxide can be removed from inside the deep trench by isotropic etching selective to the semiconductor material of the substrate so that the trench is widened by the extent to which the oxide extends into the substrate. If needed, this process of oxidation and selective removal of the oxide thereof by isotropic etching can be repeated one or more times in order to further increase the width of the lower portions of the deep trenches.

Alternatively, another way to widen the lower portion of each trench is to drive a dopant into the walls and bottom of the trench to a desired depth while protecting the upper portion of the trench by a masking layer. Thereafter, the resulting doped semiconductor material extending from the walls and bottom of the trench is removed by etching while the upper portion remains protected from such etching step.

After widening the lower portions of the trenches, a single buried plate region is formed which extends outward from the walls and bottom of the lower portion of the deep trenches. Thereafter, a dielectric layer is deposited to line the walls of the lower portions 702 of the deep trenches as a node dielectric layer 720. Thereafter, further processing is performed in a manner such as that described above with reference to FIG. 2 to complete the memory cell 700 illustrated in FIG. 7.

Figure 8:
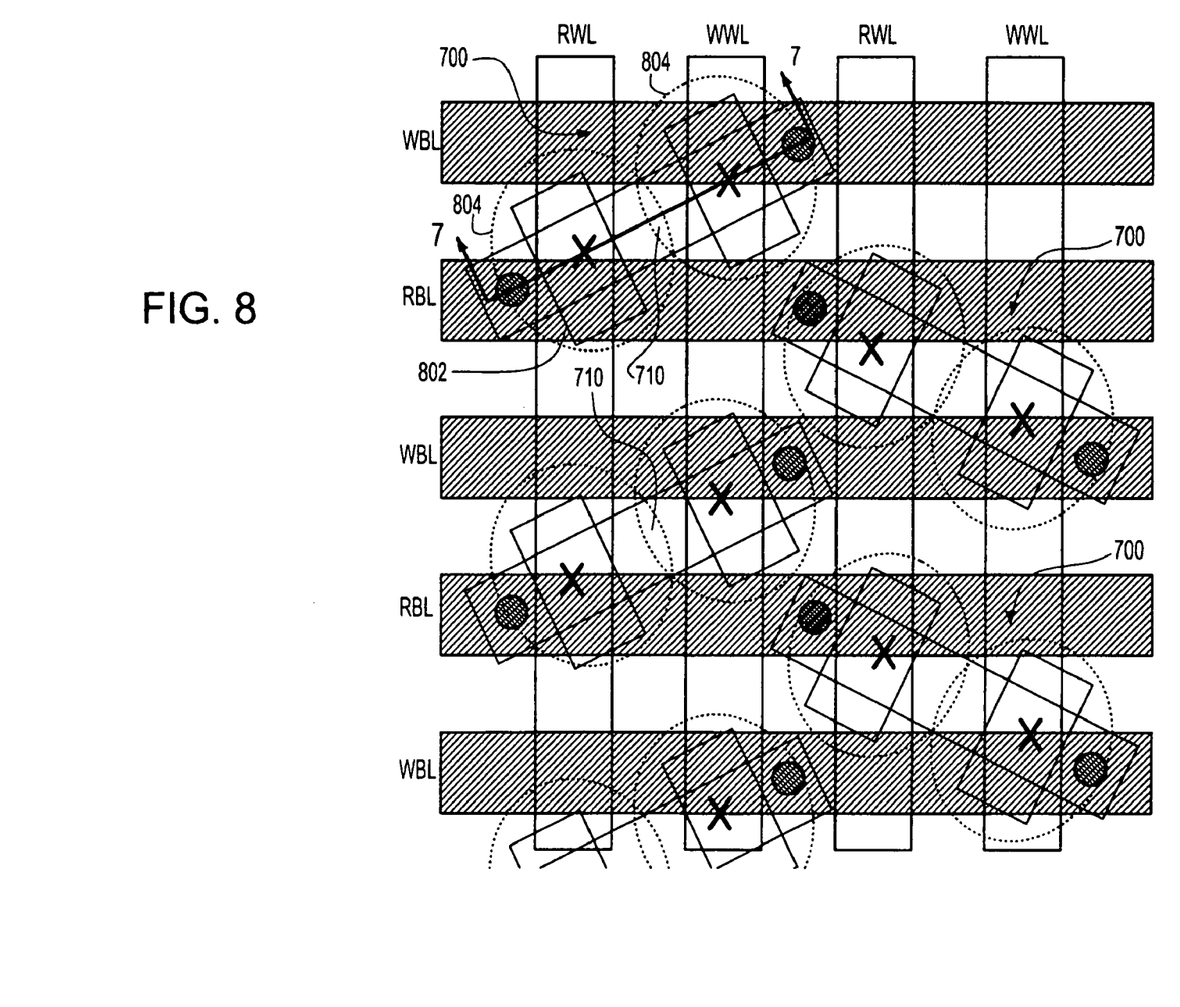
FIG. 8 is a corresponding top-down plan view of a portion of a memory array including a plurality of memory cells in accordance with the embodiment of the invention illustrated in FIG. 7.

FIG. 8 is a further diagram illustrating top-down plan view of a memory including a plurality of memory cells 700 (FIG. 7). Similar to that shown above with reference to FIG. 3, the large "X"s indicate locations where wordlines (RWL and WWL) contact gate conductors of vertical FETs in upper portions of the deep trenches. Rectangular elements 802 indicate the contours of deep trenches as normally provided via a photomask used in photolithographic process to pattern the deep trenches. The dotted circular features 804 surrounding the rectangular elements 802 indicate contours of the lower portions of the deep trenches after they are widened to provide the bottle-shape as described above. In other respects, the memory has the same or similar structure to that described above with reference to FIGS. 1-2.

Figure 9:
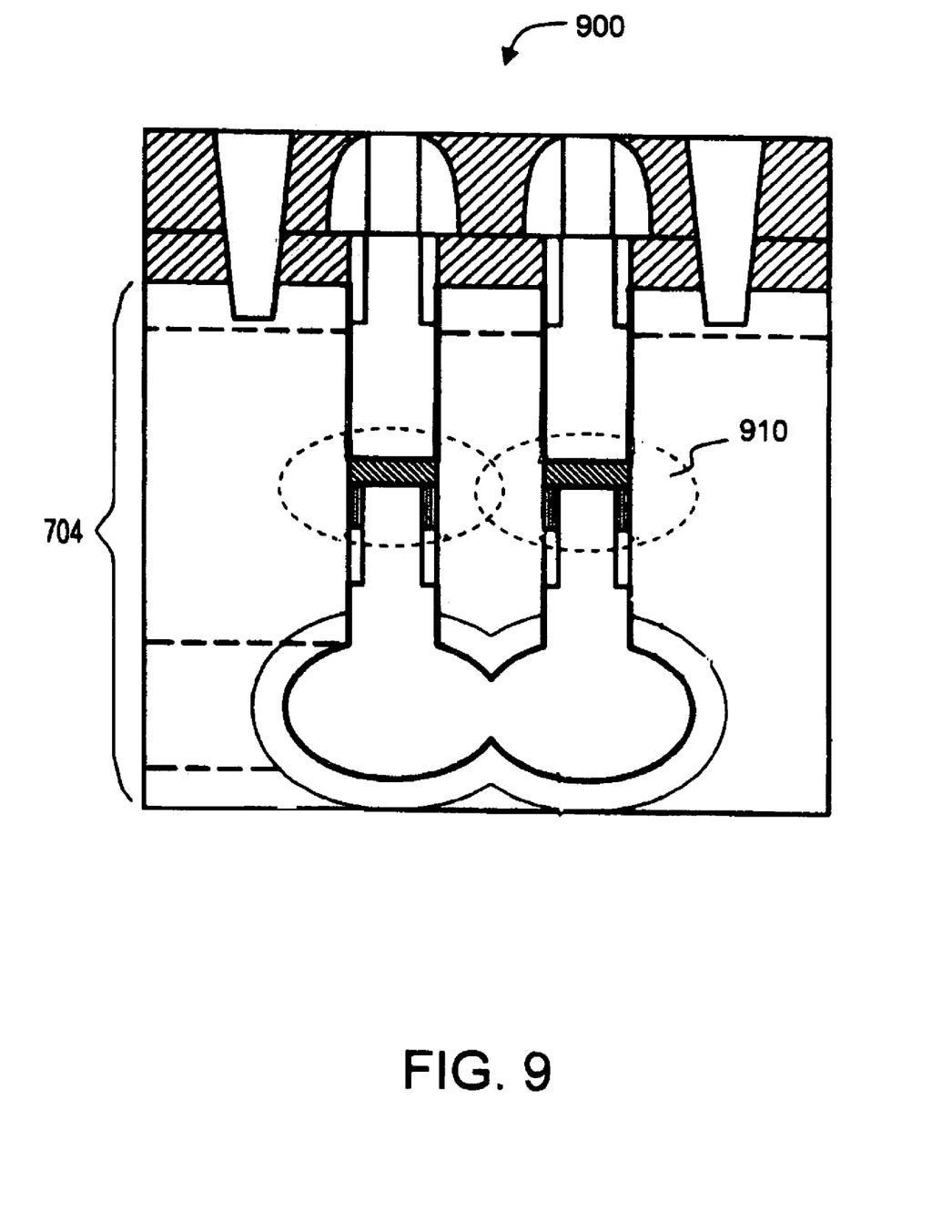
FIG. 9 is a sectional view illustrating a memory cell according to an embodiment of the invention which includes a pair of merged deep trenches having conductively joined buried strap outdiffusions (BSODs).

In yet another embodiment of the invention (FIG. 9), the techniques described above with reference to FIG. 7 for joining adjacent deep trenches are employed together with those described with reference to FIG. 2. In such case, a memory cell 900 is formed in which both the deep trenches 704 are merged and the buried strap outdiffusions (BSODs) 910 are conductively joined together as overlapped regions.

Figure 10:
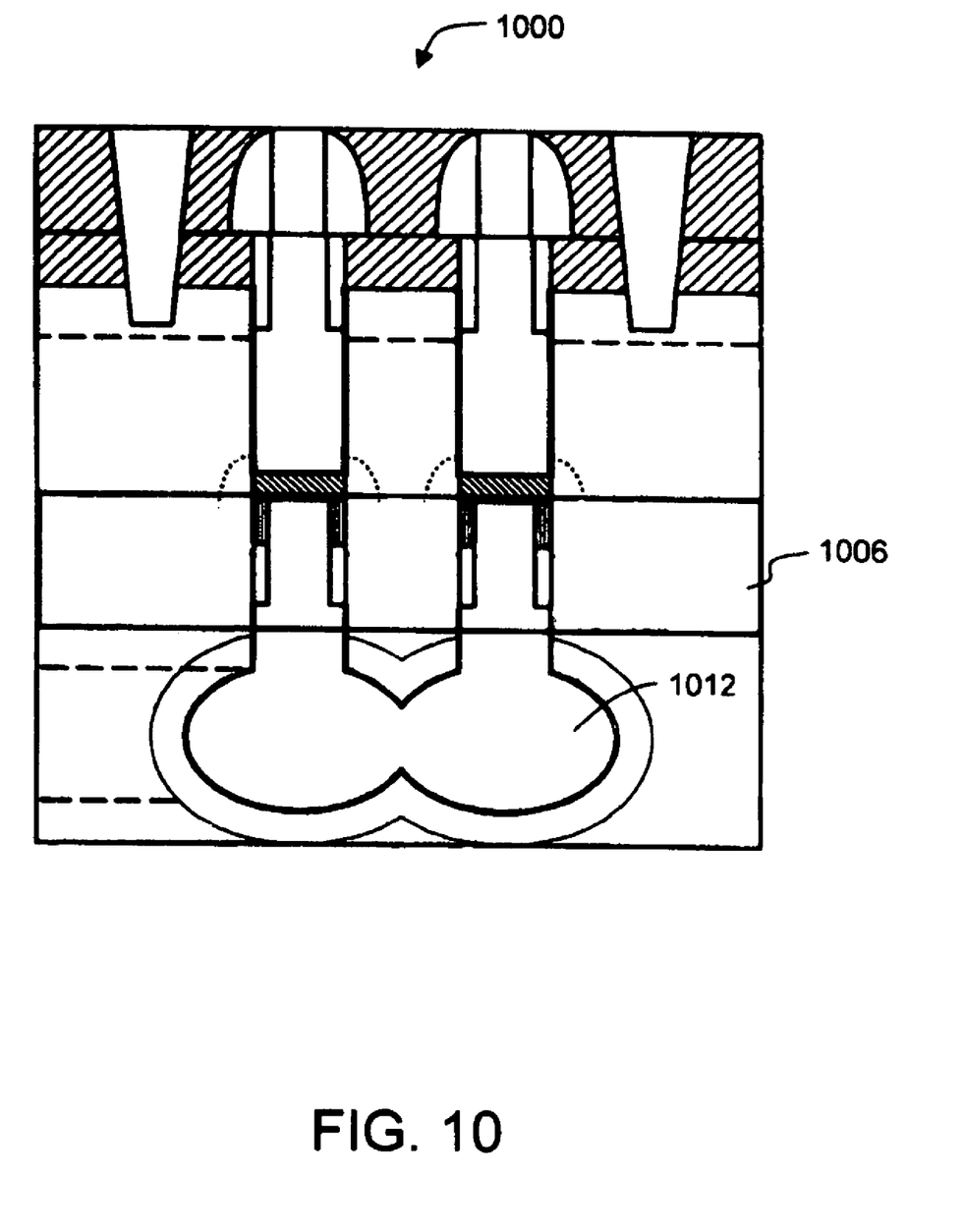
FIG. 10 is a sectional view illustrating a memory cell according to an embodiment of the invention which includes a pair of merged deep trenches provided below a BOX layer of a substrate.

In yet another variation (FIG. 10), the embodiment described with reference to FIG. 7 is combined with that shown and described above with reference to FIG. 6. In that case, a memory cell 1000 is provided in which a single joined storage node 1012 is provided in lower portions of deep trenches that are provided below a BOX layer 1006 of a semiconductor substrate.

In yet another embodiment of the invention, the techniques described above with reference to FIG. 7 for joining adjacent deep trenches are employed together with those described with reference to FIG. 2. In such case, a memory cell is formed in which both the deep trenches are merged and the buried strap outdiffusions (BSODs) are conductively joined together as overlapped regions.

In yet another variation, the embodiment described with reference to FIG. 7 is combined with that shown and described above with reference to FIG. 6. In that case, a memory cell is provided in which a single joined storage node is provided in lower portions of deep trenches that are provided below a BOX layer of a semiconductor substrate.

While the invention has been described in accordance with certain preferred embodiments thereof, many modifications and enhancements can be made thereto without departing from the true scope and spirit of the invention, which is limited only by the claims appended below.

What is claimed is:

1. A method of manufacturing a memory cell having multiple ports for permitting read and write access to a data bit, comprising:

etching a plurality of trenches into a substrate including a single-crystal semiconductor region to form a first trench and a second trench spaced apart from said first trench in a direction along a major surface of said single-crystal semiconductor region;

forming first and second trench capacitors having capacitor dielectric layers extending along walls of said first and second trenches, respectively, said plurality of trench capacitors having first capacitor plates and second capacitor plates opposite said capacitor dielectric layers from said first capacitor plates, said first capacitor plates being conductively tied together through buried strap outdiffusions ("BSODs") extending outwardly from said first and second trench capacitors into said substrate and said second capacitor plates being conductively tied together, such that said first capacitor plates are adapted to receive a same variable voltage and said second capacitor plates are adapted to receive a same fixed voltage;

forming a plurality of access transistors including a first access transistor and a second access transistor, said first access transistor having a gate conductor disposed within said first trench and said second access transistor having a gate conductor disposed within said second trench, each of said access transistors having a drain region conductively connected to said first and second trench capacitors; and forming a plurality of conductors operable to carry a plurality of control signals to operate said plurality of access transistors and to carry a plurality of data bit signals each representing a state of a data bit for a purpose of at least one of reading said data bit when said data bit is stored in said memory cell or writing said data bit when said data bit is to be stored to said memory cell.

2. The method of manufacturing a memory cell as claimed in claim 1, wherein said step of forming said first and second trench capacitors includes widening lower portions of said first and second trenches such that said lower portions are merged together and said first capacitor plates are joined together as a single storage node of said first and second trench capacitors.

3. The method of manufacturing a memory cell as claimed in claim 1, wherein said plurality of conductors are oriented at an angle to directions of an active semiconductor region of an active semiconductor region which includes said plurality of access transistors.

4. The method of manufacturing a memory cell as claimed in claim 1, wherein said step of forming said plurality of access transistors includes forming a plurality of vertical field effect transistors including first and second vertical field effect transistors disposed along upper portions of said first and second trenches above said first and second trench capacitors, respectively.

5. The method of manufacturing a memory cell as claimed in claim 1, wherein said substrate includes a buried dielectric region underlying and substantially parallel to a major surface of said substrate, and an active semiconductor region disposed above said buried dielectric region as a semiconductor-on-insulator ("SOI") region, said plurality of trenches extending vertically downward from said major surface into said buried dielectric region.

6. The method of manufacturing a memory cell as claimed in claim 1, wherein said step of forming said plurality of conductors includes forming a first wordline directly overlying said first trench capacitor and conductively connected with said gate conductor disposed within said first trench, and forming a second wordline directly overlying said second trench capacitor and conductively connected with said gate conductor disposed within said second trench.

7. The method of manufacturing a memory cell as claimed in claim 6, wherein each of said first and second access transistors includes a doped region extending along said major surface of said single-crystal semiconductor region, said method further comprising forming an array top oxide overlying said single-crystal semiconductor region.

8. The method of manufacturing a memory cell as claimed in claim 7, wherein said step of forming said plurality of conductors includes forming bitline contact vias extending through said array top oxide.

* * * * *